United States Patent
Inoue et al.

(10) Patent No.: US 7,179,725 B2
(45) Date of Patent: Feb. 20, 2007

(54) METHOD OF FABRICATING A POLYCRYSTALLINE FILM BY CRYSTALLIZING AN AMORPHOUS FILM WITH LASER LIGHT

(75) Inventors: Mitsuo Inoue, Hyogo (JP); Hidetada Tokioka, Hyogo (JP); Shinsuke Yura, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/529,373

(22) PCT Filed: Aug. 17, 2004

(86) PCT No.: PCT/JP2004/011762

§ 371 (c)(1),
(2), (4) Date: Mar. 28, 2005

(87) PCT Pub. No.: WO2005/020300

PCT Pub. Date: Mar. 3, 2005

(65) Prior Publication Data

US 2006/0141683 A1    Jun. 29, 2006

(30) Foreign Application Priority Data

Aug. 22, 2003   (JP)   ............... 2003-298648

(51) Int. Cl.
*H01L 21/20*   (2006.01)
(52) U.S. Cl. ............... 438/486; 257/E21.134
(58) Field of Classification Search ............... 438/487, 438/795, 486
See application file for complete search history.

(56) References Cited

U.S. PATENT DOCUMENTS

| 6,372,039 | B1 | 4/2002 | Okumura et al. |
| 6,566,683 | B1 | 5/2003 | Ogawa et al. |
| 6,800,541 | B2 | 10/2004 | Okumura |
| 7,033,915 | B2* | 4/2006 | Ryu et al. ............... 438/487 |
| 2004/0074881 | A1* | 4/2004 | Oishi ............... 219/121.63 |
| 2004/0253838 | A1* | 12/2004 | Yamazaki et al. ......... 438/795 |
| 2006/0051943 | A1* | 3/2006 | Inoue et al. ............... 438/487 |

FOREIGN PATENT DOCUMENTS

| JP | 2000-12484 | 1/2000 |
| JP | 2001-44120 | 2/2001 |
| JP | 2003-68644 | 3/2003 |

* cited by examiner

*Primary Examiner*—W. David Coleman
(74) *Attorney, Agent, or Firm*—Leydig, Voit & Mayer, Ltd.

(57) ABSTRACT

A method of fabricating a thin-film of a semiconductor material includes: a scanning irradiation step of, in order to form a polycrystalline silicon film on the surface of a substrate, focusing first pulse laser light having a visible wavelength into a line shape having an intensity distribution of an approximately Gaussian shape in a width direction on the surface of the substrate and applying the light such that the line shape is shifted in the width direction; an edge processing step of, after performing the scanning irradiation step in one position in one direction, applying second pulse laser light having an ultraviolet wavelength to an end region of an edge parallel to the width direction of a region having undergone the scanning irradiation; and a step of applying the scanning irradiation step again to cover a region that is adjacent to the region covered by the scanning irradiation step as well as overlaps the end region having undergone the edge processing step.

9 Claims, 12 Drawing Sheets

IRRADIATION ENERGY DENSITY ONTO THE SUBSTRATE (mJ/cm$^2$)

METHOD OF FABRICATING A POLYCRYSTALLINE FILM BY CRYSTALLIZING AN AMORPHOUS FILM WITH LASER LIGHT

TECHNICAL FIELD

This invention relates to a method of fabricating thin-film semiconductor, and more particularly, to a technique of causing recrystallization by laser irradiation.

BACKGROUND ART

A polycrystalline silicon thin-film transistor is known which uses a polycrystalline silicon film formed on the surface of an insulation substrate as a semiconductor layer, instead of a conventional semiconductor substrate. In such a polycrystalline silicon thin-film transistor, it is desirable to uniformly form polycrystalline silicon of a grain size as large as possible, since the grain boundary of silicon limits mobility of carriers. In a so called laser recrystallization method, in which amorphous silicon as a starting material is heated and melted by laser irradiation and then cooled down for recrystallization, however, it was difficult to control the temperature of melted silicon which promotes crystal growth. Thus, it was difficult to form crystal of a large grain size uniformly and stably.

Meanwhile, there is a technique disclosed in Japanese Patent Laying-Open No. 2000-286195 (Patent Document 1) In Patent Document 1, a visible light laser, Nd:YAG2ω laser beam is focused into a thin line shaped laser beam to have light intensity distribution of an approximately Gaussian shape in the width direction, and is applied as a laser beam having at least a predetermined energy density gradient on amorphous silicon. By employing visible laser light of lower absorption coefficient on amorphous silicon, this technique provides a limited temperature gradient in the film thickness direction while intentionally forming temperature gradient in the width direction to cause one dimensional lateral growth. This leads to a polycrystalline silicon film having a crystal array of a large grain size.

Patent Document 1: Japanese Patent Laying-Open No. 2000-286195

DISCLOSURE OF THE INVENTION

Problems to Be Solved by the Invention

In the example of Patent Document 1 described above, since a visible light laser beam (hereinafter referred to as "visible laser") having a beam shape of a Gaussian shape distribution in the width direction is used, lateral growth in the width direction takes place. Growth occurs in the width direction, not in the film thickness direction, so that it is not limited by the film thickness and a larger grain size can be obtained. More specifically, like common laser recrystallization, a laser beam is focused into a line shape and applied while shifted in the width direction to sequentially cause crystallization. By scanning in this manner, the entire surface of amorphous silicon is crystallized.

However, in an edge portion parallel to the scanning direction of a region scanned by one scan as one line, clear temperature gradient is not formed in the scanning direction, i.e. in the width direction of a thin line shaped irradiated region. Rather, temperature gradient is formed in the longitudinal direction of the irradiated region. Thus, crystals laterally grown in the longitudinal direction of the irradiated region also exist. Due to low absorption coefficient of the visible laser, this crystalline portion cannot melt even if applied the visible laser again as an overlap portion between an old and a new scanning lines in subsequently scanning of an adjacent line. That is, in the edge portion parallel to the longitudinal direction, a crystalline portion, which is different from crystals laterally grown in the width direction, remains as arranged in the scanning direction of the substrate. When used as thin-film semiconductor, the portion becomes a line-like defect which has properties different from other portions. For example, when the thin-film semiconductor is applied to a display device, the defect causes line-like inconsistency in display.

Means for Solving the Problems

An object of the present invention is to provide a fabrication method of thin-film semiconductor which does not cause a line-like defect having properties different from other portions in seams between scanning lines.

To achieve the object, a method of fabricating thin-film semiconductor according to the present invention includes: a scanning irradiation step of, in order to a form polycrystalline silicon film on the surface of a substrate, focusing first pulse laser light of a visible wavelength into a line shape having an intensity distribution of an approximately Gaussian shape in the width direction on the surface of the substrate and applying the light such that the line shape is shifted in the width direction; an edge processing step of, after performing the scanning irradiation process in one position in one direction, applying second pulse laser light having an ultraviolet wavelength to an end region of an edge parallel to the width direction of the region having undergone the scanning irradiation; and a step of applying the scanning irradiation step again to cover a region which is adjacent to the region covered by the scanning irradiation step as well as overlaps the end region having undergone the edge processing step.

EFFECTS OF THE INVENTION

According to the present invention, even if scanning by the first pulse laser light is repeated for multiple lines to make a large region into polycrystalline silicon, after scanning each line, the second pulse laser light of an ultraviolet wavelength is applied as the edge processing step, so that the boundary region can be made into amorphous and the crystal growth due to the first pulse laser light can be made appropriate. As a result, the joints between each scanning line can be prevented from becoming a line-like defect, and a uniform polycrystalline silicon film can be formed across the entire surface.

BEST MODES FOR CARRYING OUT THE INVENTION

Figure 1:
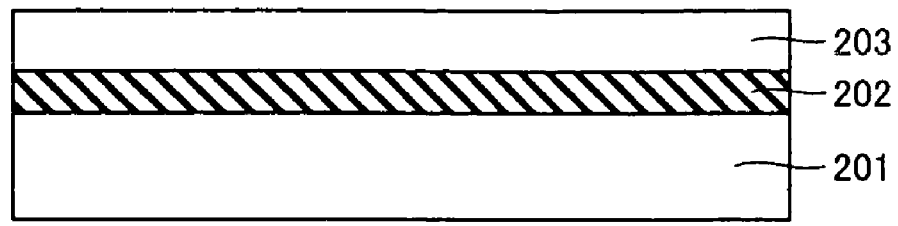
FIG. 1 shows a first step of a fabrication method of a semiconductor device in which a fabrication method of thin-film semiconductor according to the present invention is employed.

Referring to FIGS. 1–5, situations in which a fabrication method of thin-film semiconductor according to the invention is used will be described. As shown in FIG. 1, using CVD (Chemical Vapor Deposition) method, a base film 202 is formed from a silicon oxide film and the like on the upper surface of an insulation substrate 201. Base film 202 serves as a barrier to prevent an impurity in insulation substrate 201 from diffusing into a polycrystalline silicon film to be formed. Further, base film 202 is covered with an amorphous silicon film 203.

Figure 2:
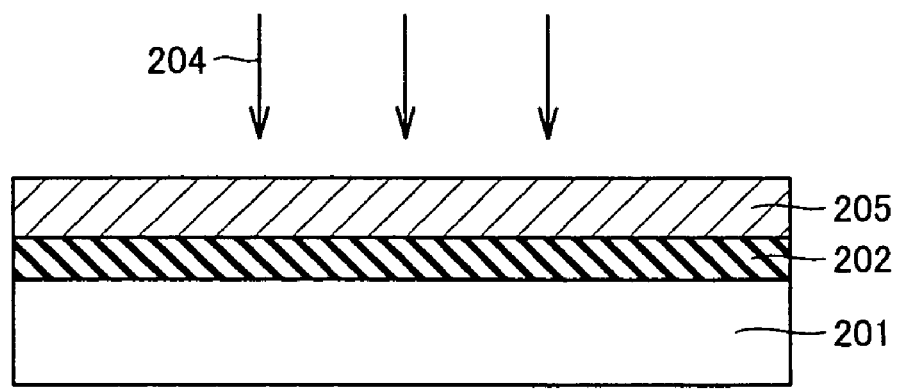
FIG. 2 shows a second step of the fabrication method of a semiconductor device in which the fabrication method of thin-film semiconductor according to the present invention is employed.
Figure 3:
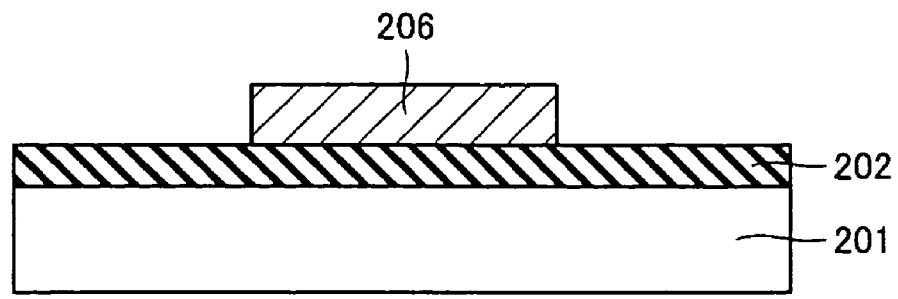
FIG. 3 shows a third step of the fabrication method of a semiconductor device in which the fabrication method of thin-film semiconductor according to the present invention is employed.

As shown by an arrow 204 in FIG. 2, a laser light having a visible range wavelength of at least 350 nm is applied. The application of the laser light causes amorphous silicon film 203 to heat up and melt. A polycrystalline silicon film 205 is formed when the thus melted silicon is cooled down and solidified. Then, using a photolithography technique, as shown in FIG. 3, a polycrystalline silicon film 206 is patterned into an island shape.

Figure 4:
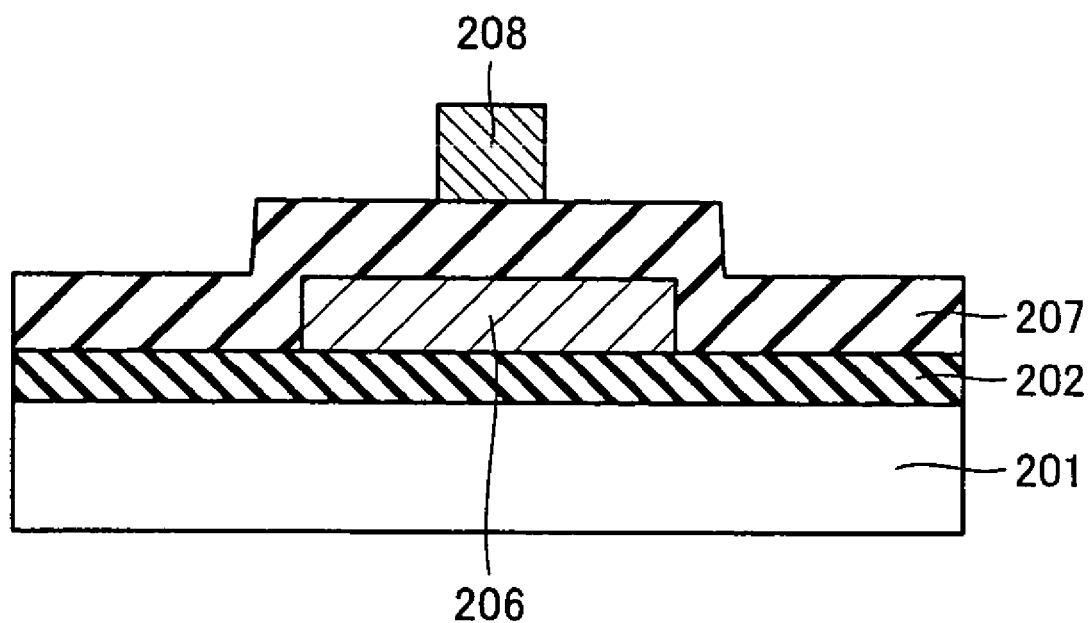
FIG. 4 shows a fourth step of the fabrication method of a semiconductor device in which the fabrication method of thin-film semiconductor according to the present invention is employed.
Figure 5:
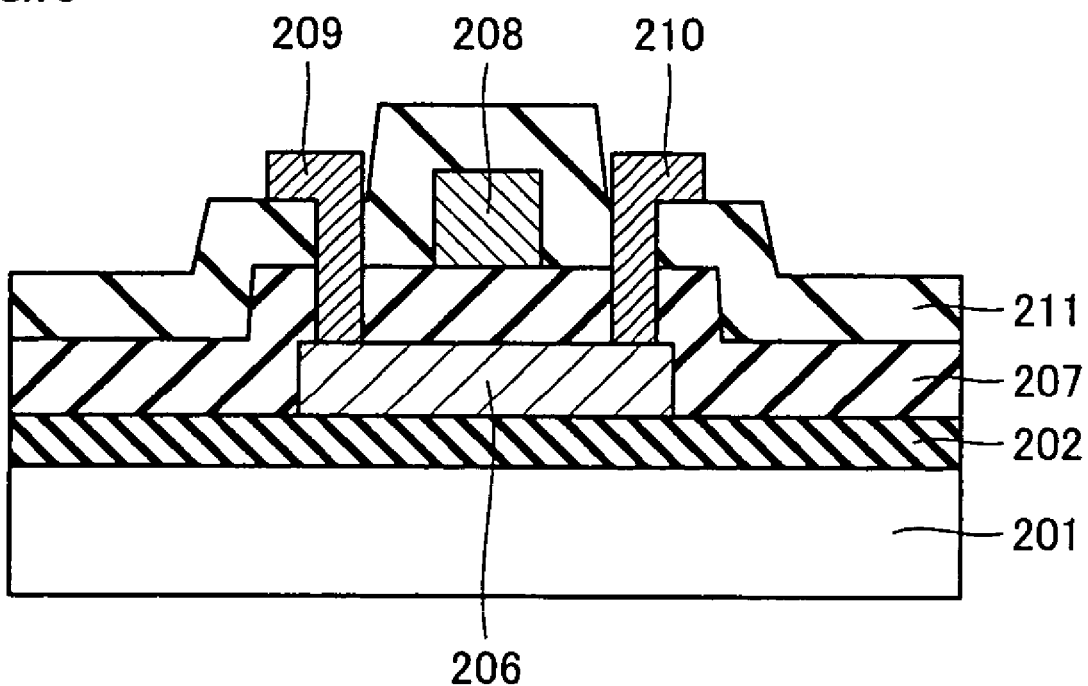
FIG. 5 shows a fifth step of the fabrication method of a semiconductor device in which the fabrication method of thin-film semiconductor according to the present invention is employed.

As shown in FIG. 4, a silicon oxide film is formed as a gate insulating film 207, and in addition, a gate electrode 208 is formed. As shown in FIG. 5, a silicon oxide film or a silicon nitride film is formed as an interlayer insulation film 211, and a source electrode 209 and a drain electrode 210 are formed. In this manner, a thin-film transistor is formed with polycrystalline silicon film 206 as a semiconductor layer.

Major interest of the present invention is the step from FIGS. 1 to 2, i.e. the step of applying a laser light to amorphous silicon film 203 to cause it to once melt, and then cool down and solidify in order to form polycrystalline silicon film 205. In the following, this step will be described in detail.

(First Embodiment)

Figure 6:
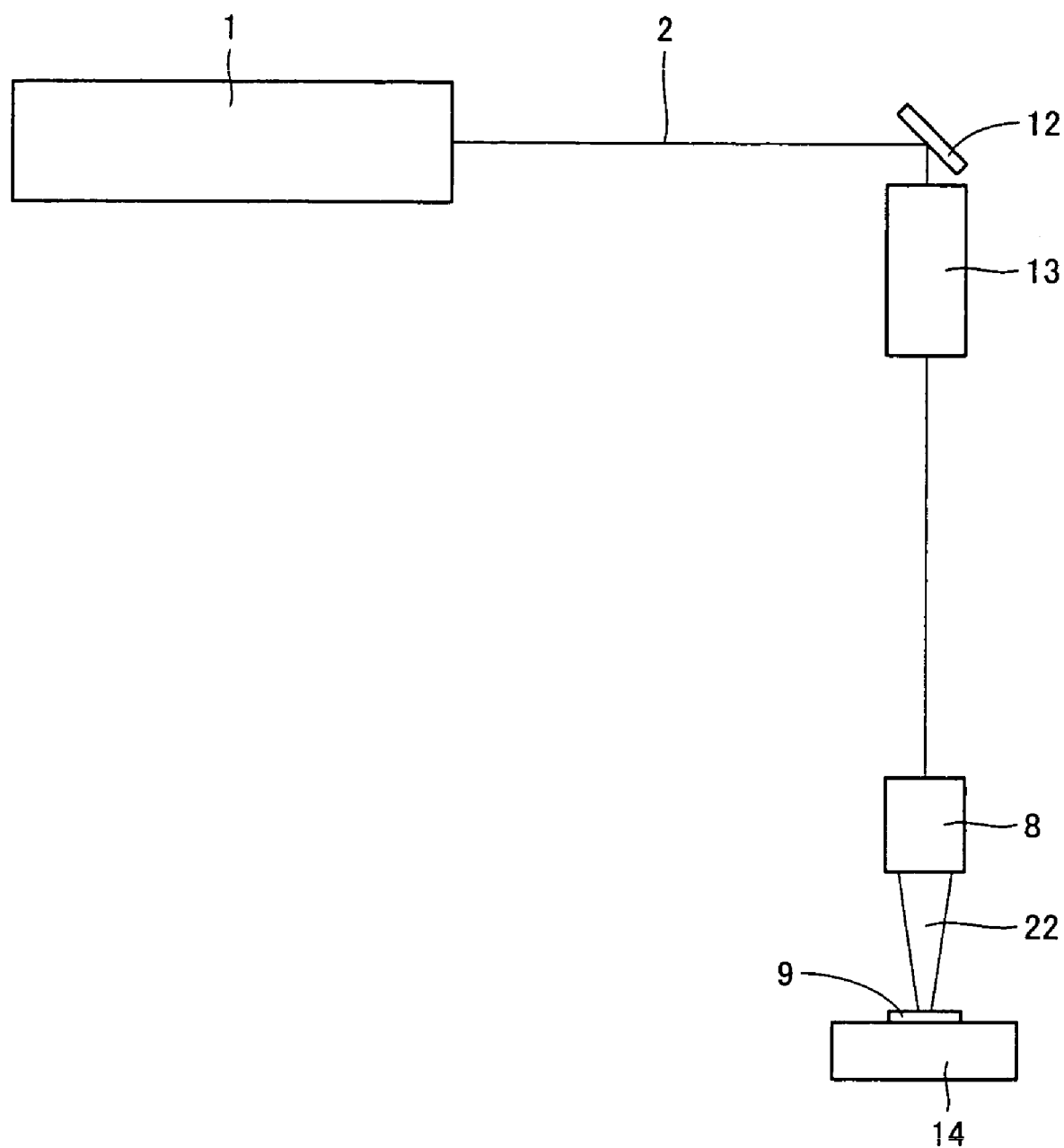
FIG. 6 is a conceptual view of a laser annealing device employed for a fabrication method of thin-film semiconductor in a first embodiment according to the present invention.

Referring to FIG. 6, a laser annealing device used in a fabrication method of thin-film semiconductor in a first embodiment according to the present invention will be described. The laser annealing device is provided with a pulse laser light source 1. Pulse laser source 1 is to generate first pulse laser light 2 having a wavelength belonging to the visible range. More specifically, first pulse laser light 2 is Nd:YAG2ω pulse laser light of a lasing wavelength of 532 nm. An object to be irradiated 9 is insulation substrate 201 having amorphous silicon film 203 on its surface, and when irradiated with laser light, amorphous silicon film 203 is melted and recrystallized to form a polysilicon film.

Along the optical path from pulse laser light source 1 to object 9, a bend mirror 12 to bend at right angle the direction of travel of outgoing first pulse laser light 2, a beam adjusting optical system 13, and a focusing and irradiating optical system 8 focusing pulse laser light 2 to irradiate object 9 are arranged in this order. Object 9 is placed on a stage 14. Stage 14 can be moved vertically and horizontally.

First pulse laser light 2 outgoing from pulse laser light source 1 is bent at right angle by bend mirror 12 and enters into focusing and irradiating optical system 8. First pulse laser light 2 is focused into a line shape by focusing and irradiation optical system 8. The height of object 9 is adjusted by stage 14 so that the focusing point of first pulse laser light 2 is positioned on object 9.

Referring to FIGS. 7–16, a fabrication method of thin-film semiconductor in the first embodiment according to the present invention will be described.

Figure 7:
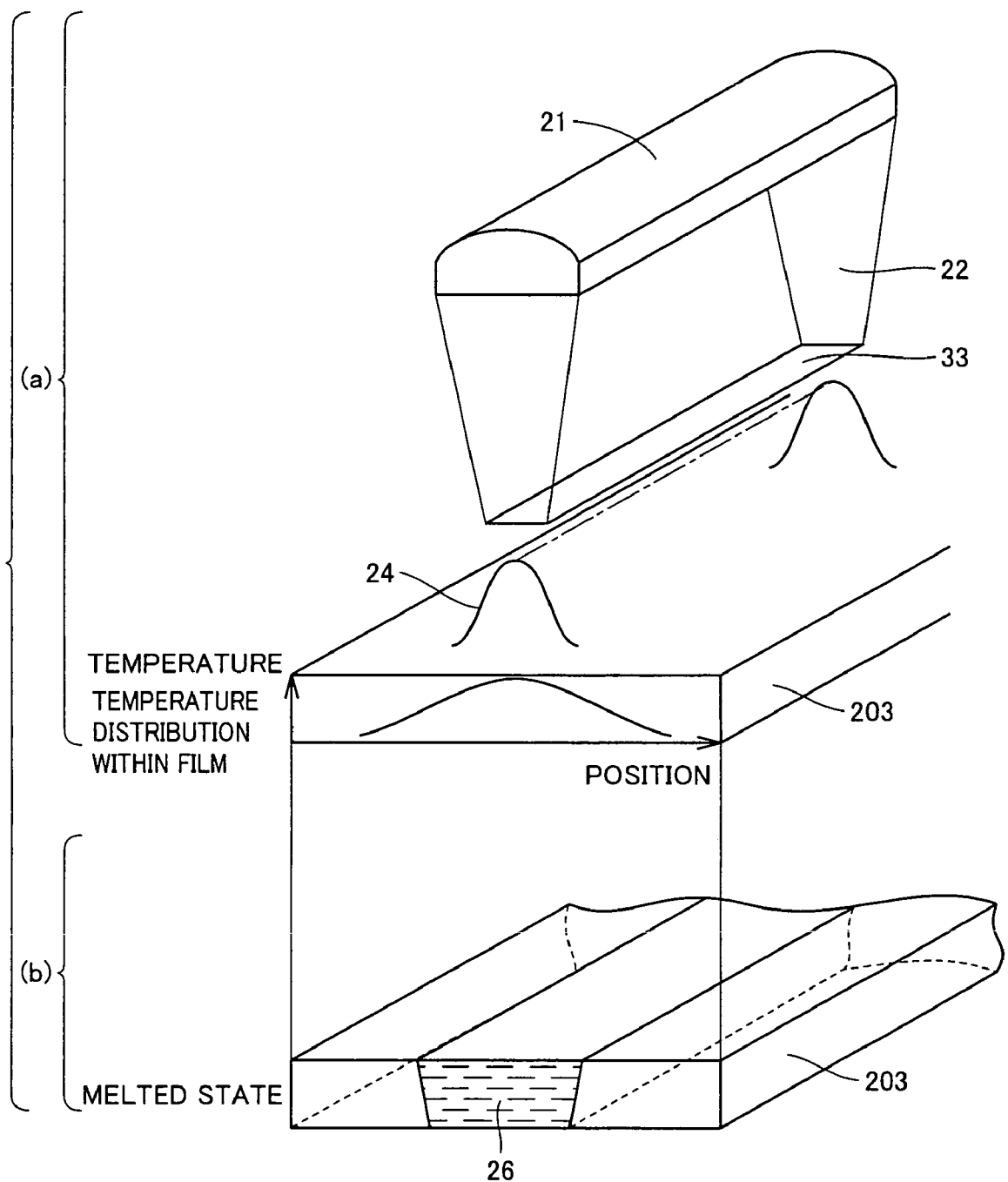
FIG. 7 is shows a scanning irradiation step included in the fabrication method of thin-film semiconductor in the first embodiment according to the present invention.

The fabrication method includes a scanning irradiation step. In the step, first pulse laser light 2 emitted from pulse laser light source 1 is focused into a line shape by a focusing lens 21 of focusing and irradiation optical system 8 to become first pulse laser light 22, as shown in FIG. 7(a). FIG. 7 as a whole is a conceptual view for illustrating how first pulse laser light 22 is applied to amorphous silicon film 203 to cause it to melt.

FIG. 7(a) shows a profile 24 of first pulse laser light 22 which is focused and applied so that an irradiated region 33 becomes a line shape on amorphous silicon film 203. As shown in FIG. 7(a), profile 24 has a so-called top flat shape having almost no change and being uniform in the longitudinal direction of irradiated region 33 while having an approximately Gaussian distribution in the width direction of irradiated region 33.

Figure 8:
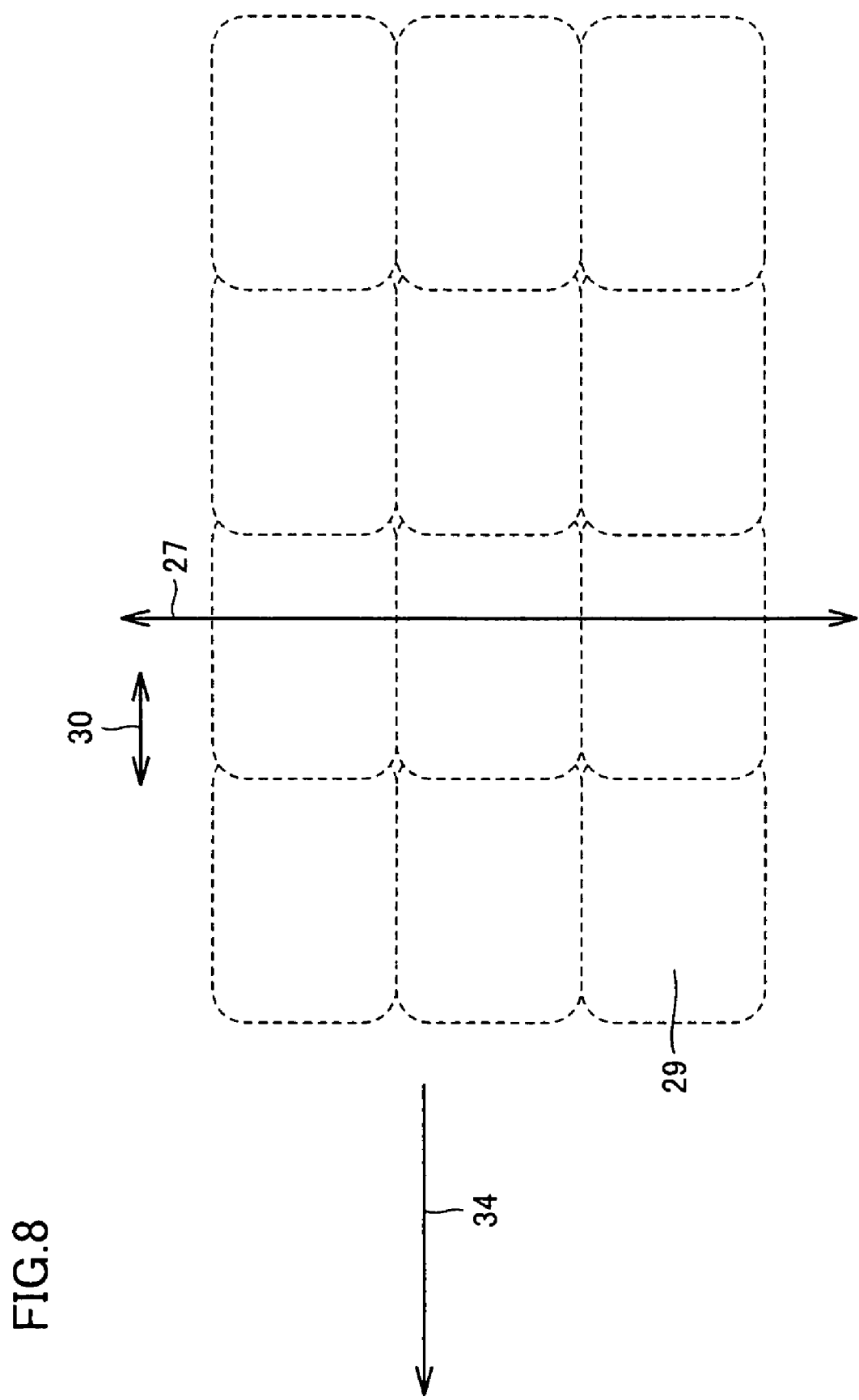
FIG. 8 shows a crystal grain grown due to the scanning irradiation step included in the fabrication method of thin-film semiconductor in the first embodiment according to the present invention.

By performing heat treatment by Nd:YAG2ω pulse laser of the lasing wavelength of 532 nm, amorphous silicon film 203 is heated almost uniformly in the film thickness direction, due to low absorption coefficient of Nd:YAG2ω pulse laser relative to amorphous silicon. The lateral temperature gradient caused by the laser irradiation within the silicon film is formed only in the width direction of line shaped irradiated region 33. Therefore, as shown in FIG. 7(*b*), of amorphous silicon film 203, a region irradiated with a beam of at least a predetermined intensity is entirely melted in the depth direction. That is, a portion 26 which is entirely melted in the depth direction is locally produced in a line shaped region. Due to small temperature gradient in the depth direction as well as in the longitudinal direction of line shaped irradiated region 33 (refer to FIG. 7(*a*)), crystal growth will be one dimensional lateral growth in the width direction of irradiated region 33, and large crystal grains of a grain size of a few μm are formed. Since the direction of crystal growth is the width direction of irradiated region 33, a crystal grain 29 of a polycrystalline silicon film formed by the laser irradiation is in line with the width direction 30 of the irradiated region as shown in FIG. 8. FIG. 8 is an enlarged view of a portion of the surface of object 9. In the scanning irradiation step, as shown in FIG. 8, focused first pulse laser light 22 is applied to the irradiated region extending in a longitudinal direction 27 while scanning such that the line shape is shifted in the width direction 30. In other words, scanning is relatively performed to amorphous silicon film23 in the direction of an arrow 34.

Figure 9:
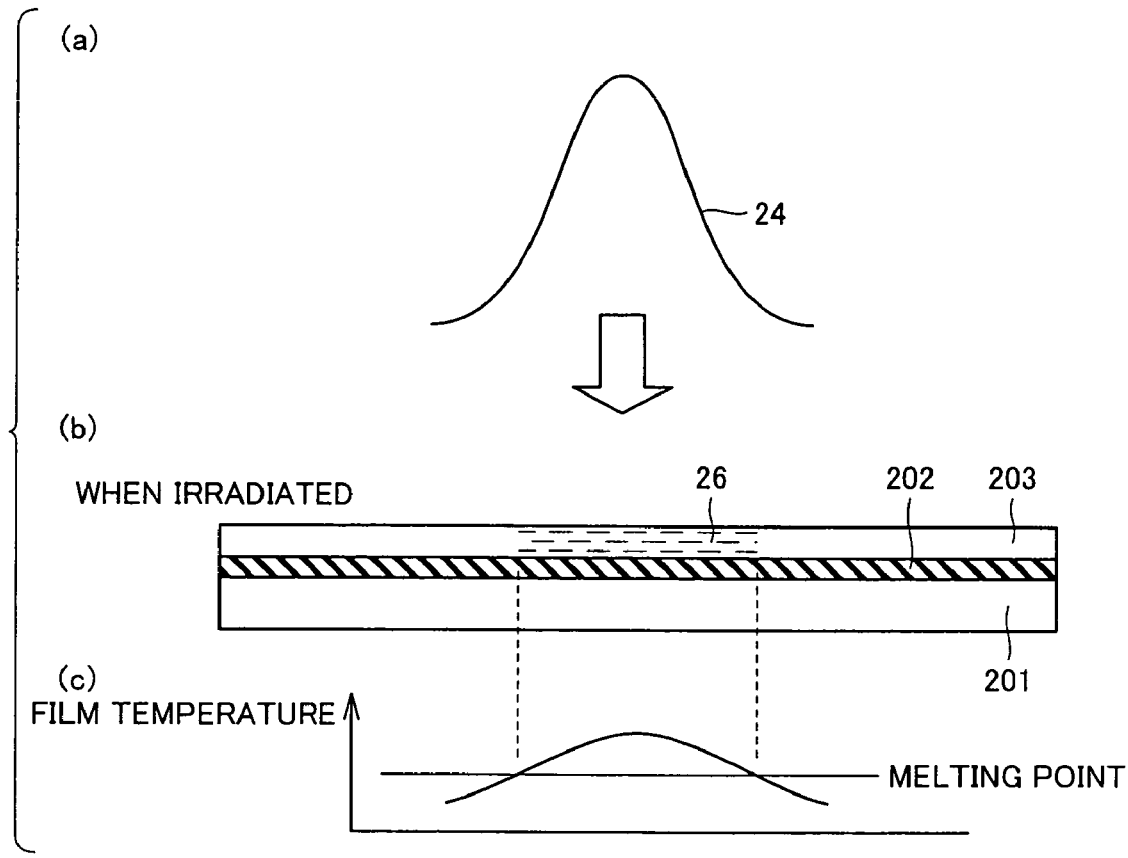
FIG. 9 shows laser irradiation in the first embodiment according to the present invention: (a) is a graph of profile of energy density distribution in the width direction; (b) is a cross section for illustrating how a melted portion in an object to be irradiated is produced; and (c) is a graph of temperature distribution within the object to be irradiated.
Figure 10:
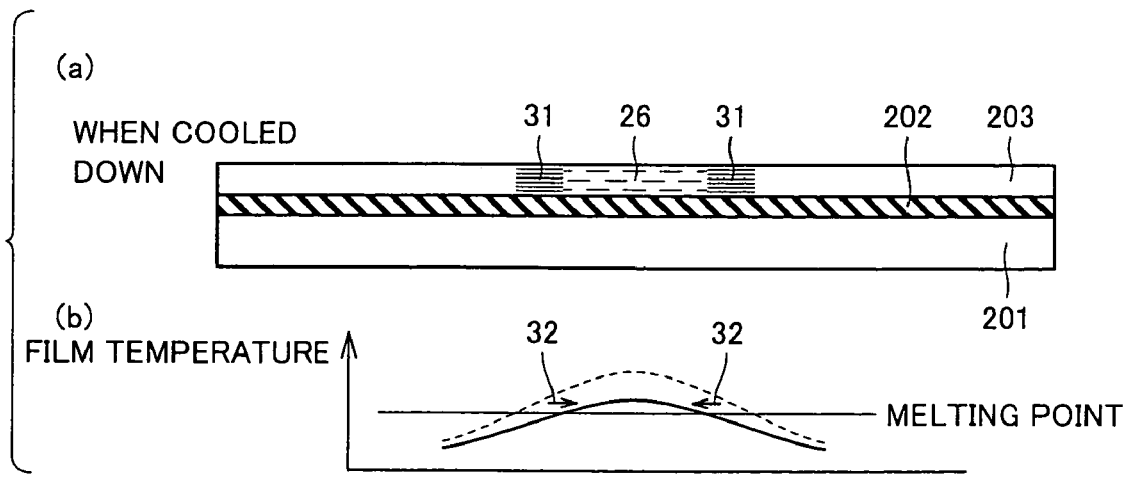
FIG. 10 is shows how crystals laterally grow due to the scanning irradiation step included in the fabrication method of thin-film semiconductor in the first embodiment according to the present invention.

As described above, the process of lateral growth in a heat treatment by a visible laser such as Nd:YAG2ω pulse laser of the lasing wavelength of 532 nm, i.e. by laser light of a wavelength of at least 350 nm, is significantly affected by lateral temperature distribution formed within the silicon film. To say, it is much affected by energy density distribution in the width direction of the laser light which is focused into a line shape and applied. The energy density distribution in the width direction has profile 24, as shown in FIG. 9(*a*), and locally causes melted portion 26 in amorphous silicon film 203, as shown in FIG. 9(*b*). In this state, amorphous silicon film 203 has temperature distribution as shown in FIG. 9(*c*). As a result, only a portion of amorphous silicon film 203 which is higher than the melting point is melted, and becomes melted portion 26 as shown in FIG. 9(*b*). The heat once introduced into the silicon film by the laser light irradiation, as shown in FIG. 9(*b*), then uniformly dissipates to other portions of object 9. Due to the dissipation of the heat, the lateral temperature distribution curve within the silicon film generally, uniformly decreases, as shown in FIG. 10(*b*). Therefore, as shown by an arrow 32 in FIG. 10(*b*), lateral crystal growth takes place in the direction from a portion that falls in temperature under the melting point earlier toward a portion that does later. In this manner, as shown in FIG. 10(*a*), a laterally grown crystal 31 is formed.

The lateral crystal growth stops when it is interrupted by a microcrystal grown due to natural nucleation in the cooling process. Therefore, to grow a crystal of a large grain size as laterally grown crystal 31, it is desirable to grow a crystal as long as possible before natural nucleation occurs. To do so, the rate of crystal growth needs to be faster. Generally, the rate of crystal growth v in a micro region is represented by an equation $v = k\Delta T/\Delta x$, wherein k is a rate constant, $\Delta T$ is a temperature difference in the micro region, and $\Delta x$ is a width of the micro region. If a temperature difference exists in the lateral direction within the silicon film, steeper gradient in temperature distribution of the region having a temperature that is beyond the melting point leads to a faster crystal growth rate, and as a result, a polycrystalline silicon film of a large crystal grain size can be formed. Taking this into account, steeper gradient in lateral temperature distribution within the silicon film can be achieved by steeper gradient in irradiation energy density distribution on the target surface. Object 9 may be scanned and irradiated in one direction in order to make a predetermined region extending on the substrate's surface into a polycrystalline silicon film.

Figure 11:
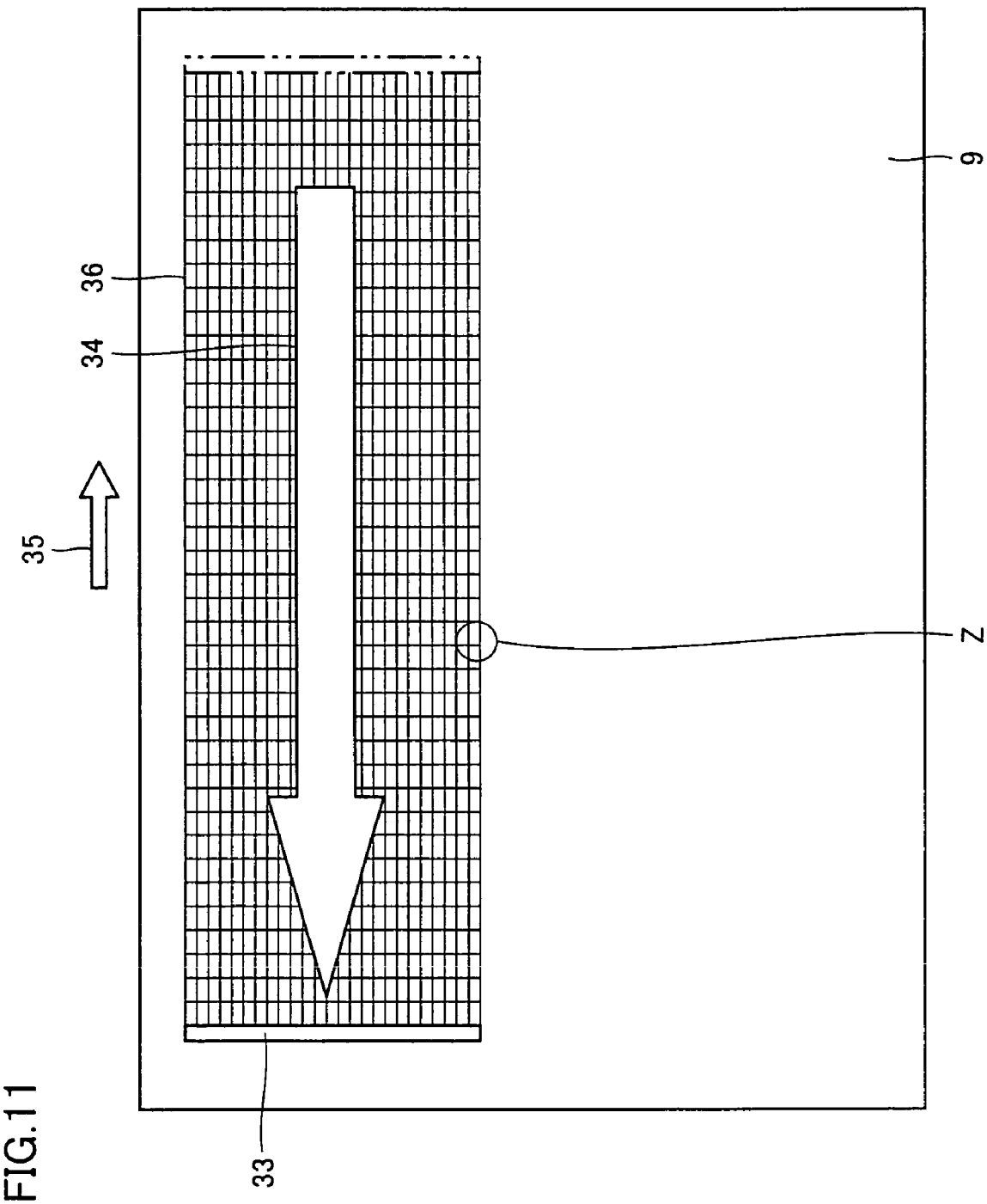
FIG. 11 shows the state of crystals when the scanning irradiation step included in the fabrication method of thin-film semiconductor in the first embodiment according to the present invention is finished.
Figure 12:
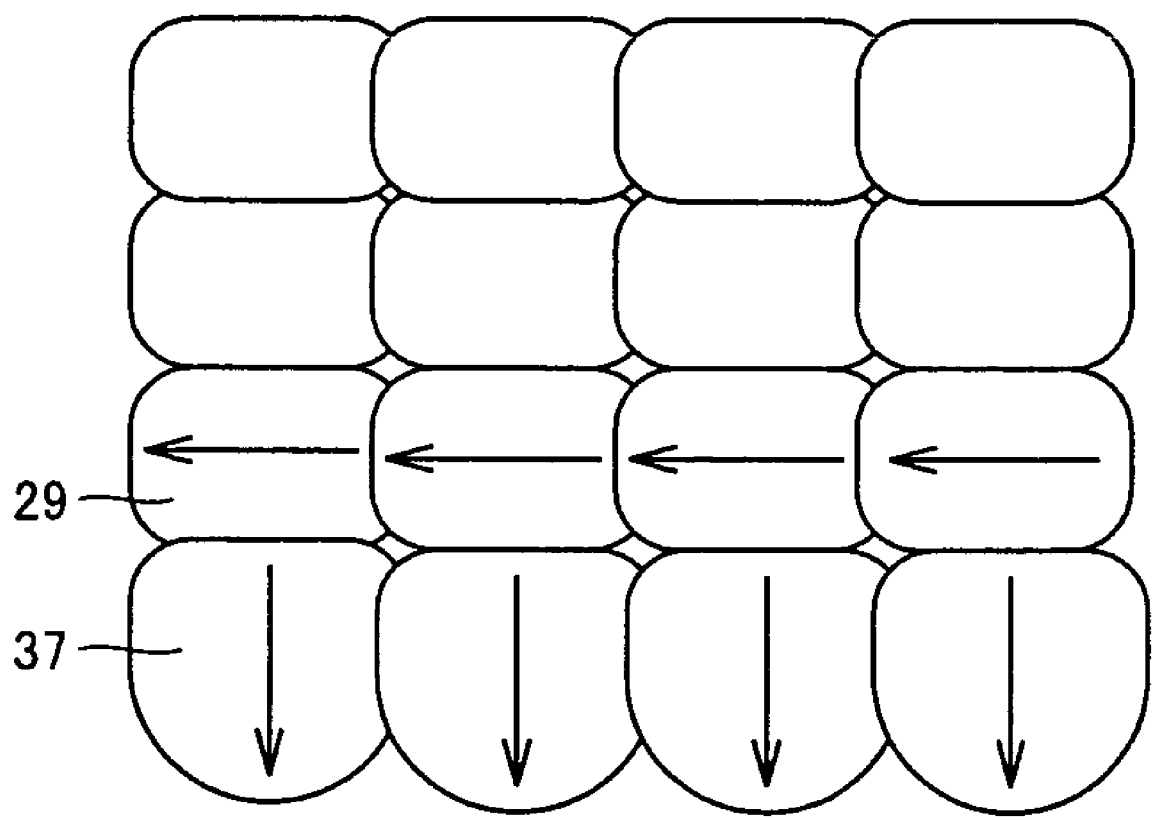
FIG. 12 is an enlarged view of a portion Z in FIG. 11.

FIG. 11 shows the state of crystals when region 33 irradiated by focused first pulse laser light 22 has finished scanning of the substrate in one direction. As to scanning of the substrate, since it suffices to scan the substrate relatively, either first pulse laser light 22 or object 9 may be moved. In this embodiment, object 9 is moved in the direction of an arrow 35 without moving first pulse laser light 22. Therefore, scanning for object 9 is relatively performed in the direction of arrow 34. FIG. 12 shows an enlarged view of a portion Z in FIG. 11. As described above, the profile of temperature distribution at both ends in the longitudinal direction of irradiated region 33 does not become a perfect top flat shape, and slight temperature gradient occurs at the both ends. Thus, as shown in FIG. 12, crystal grain 29 laterally grown in the width direction of the irradiated region is formed except for in the ends in the longitudinal direction of the irradiated region, where crystal grain 37 laterally grown along the longitudinal direction is formed.

After scanning of the substrate in one direction by first pulse laser light 22 is finished as the scanning irradiation step in this manner, the following process is performed as the edge processing step.

Figure 13:
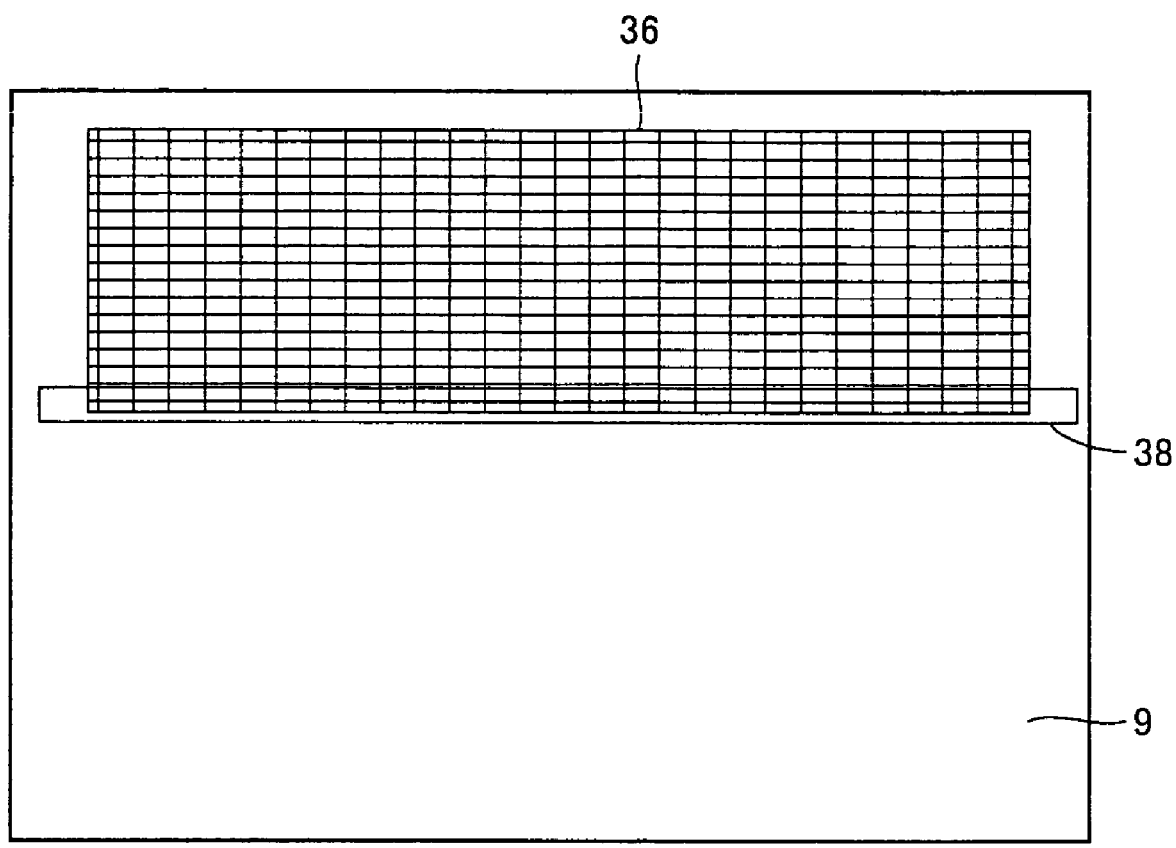
FIG. 13 is shows an edge processing step included in the fabrication method of thin-film semiconductor in the first embodiment according to the present invention.

Second pulse laser light of a wavelength belonging to the ultraviolet range is formed into a beam pattern of an elongate shape having a top flat profile both in the width direction and the longitudinal direction. Then, as shown in FIG. 13, it is applied to the ends of the edge parallel to the width direction of thin line shaped irradiated region 33 of region 36 crystallized by first pulse laser light 22, i.e. to the region including peripheral longitudinal sides of region 36. In the present embodiment, the second pulse laser light is focused and applied to an elongate shaped region 38 which can totally cover the edge parallel to the width direction of thin line shaped irradiated region 33 (refer to FIG. 7(*a*)) of region 36.

Figure 14:
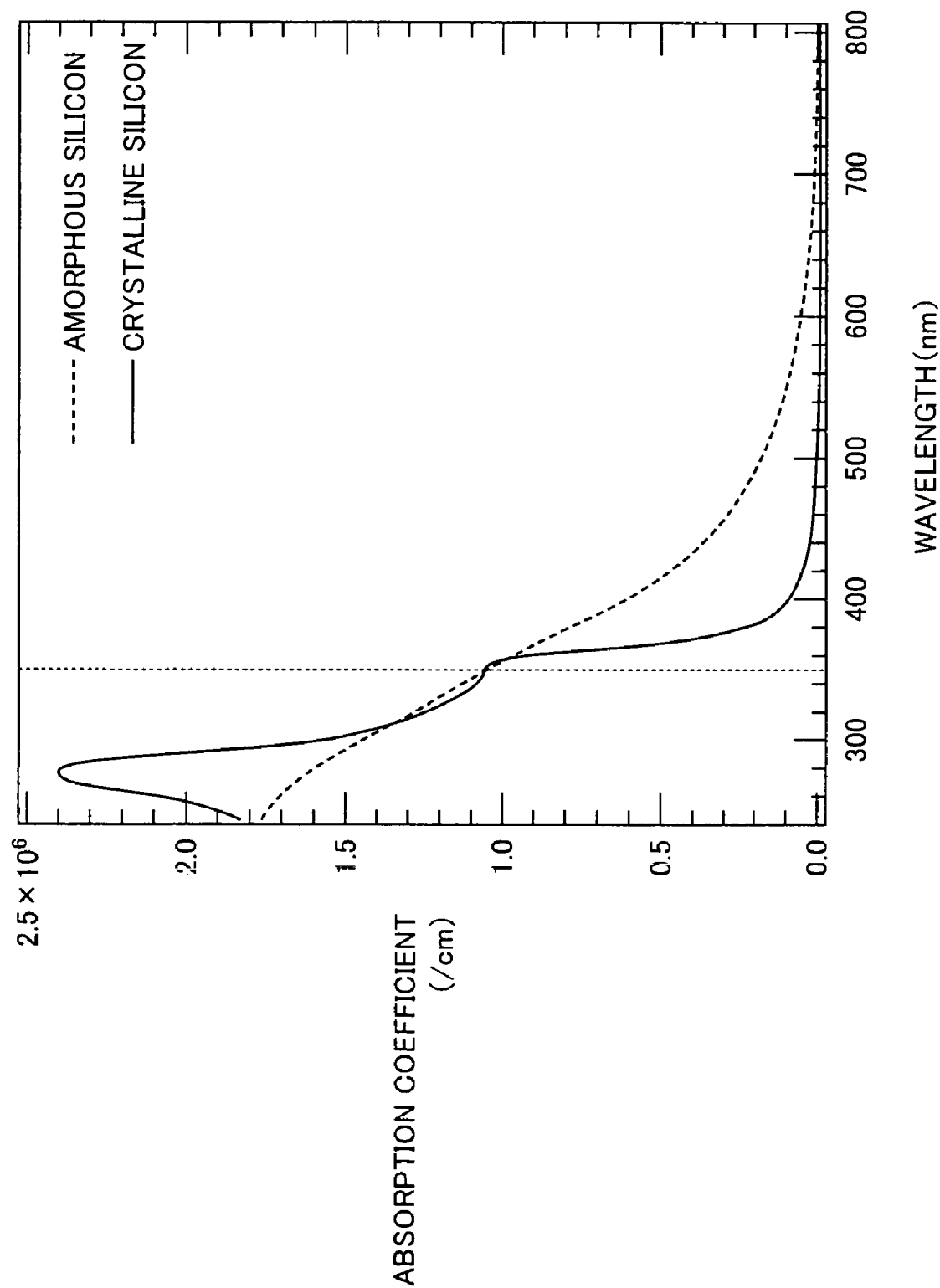
FIG. 14 is a graph showing a relation between wavelength and absorption coefficient.
Figure 15:
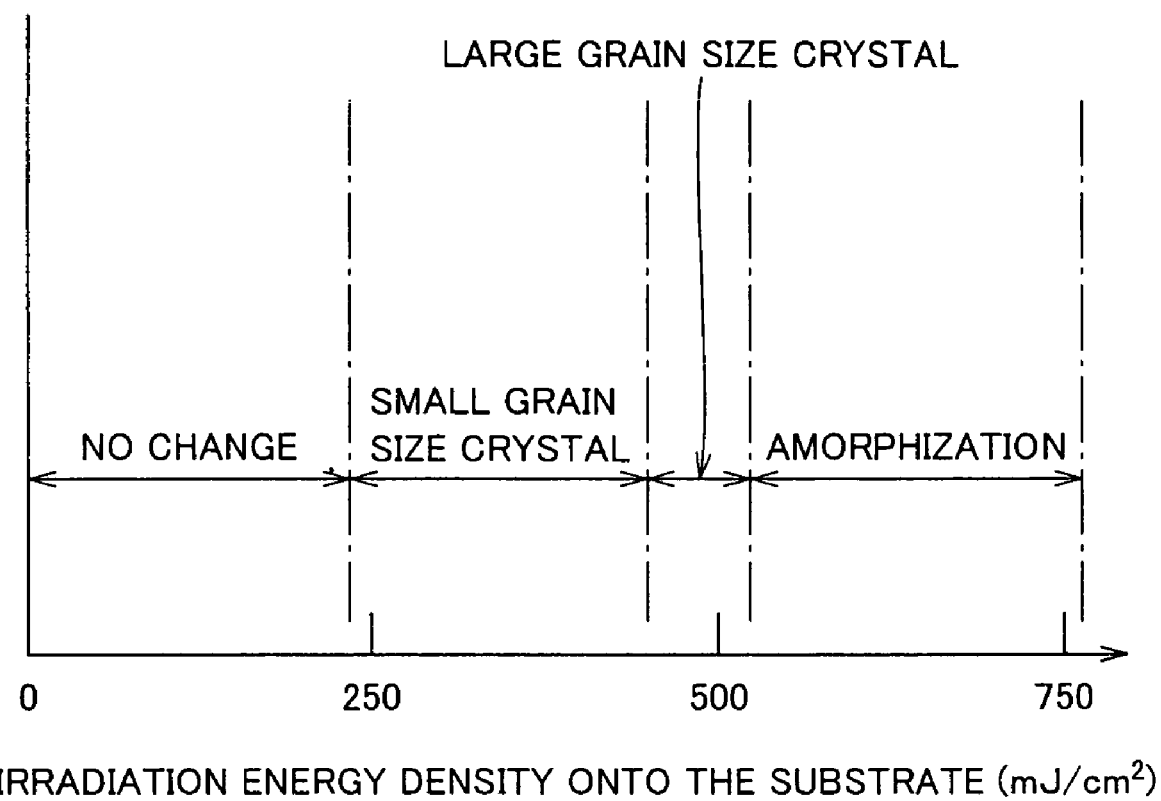
FIG. 15 is a graph showing a relation between irradiation energy density of the second pulse laser light and the state of crystals formed after irradiation.

As shown in FIG. 14, at an ultraviolet wavelength, absorption coefficient is almost same for amorphous silicon and crystallized silicon, and its absolute value is very large compared to light with a visible wavelength of at least 350 nm. Regardless of the quality of a silicon film to be irradiated, energy is absorbed on the surface and causes large temperature gradient in the film thickness direction so that lateral growth does not occur. FIG. 15 shows a relation between the irradiation energy density of the second pulse laser light of an ultraviolet wavelength and the state of crystals formed after the irradiation. The state of crystals shown in this graph was observed with an optical microscope. In this experiment, it was observed that, approximately at an irradiation energy density beyond 600 mJ/cm$^2$, amorphous silicon was achieved regardless of the state of a silicon film before irradiation.

Figure 16:
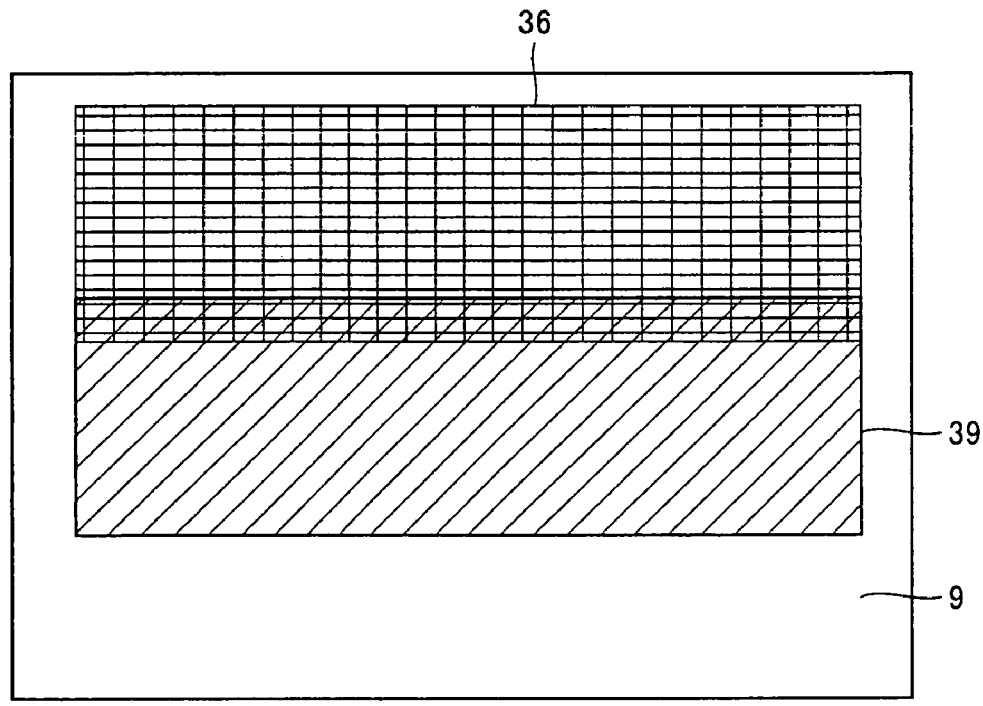
FIG. 16 shows the state when the scanning irradiation step is applied repeatedly in the first embodiment according to the present invention.

After the second pulse laser light is applied to make the sides in the longitudinal direction of region 36 into amorphous as the edge processing step as shown in FIG. 13, scanning of the substrate is performed again by the first pulse laser light of a visible wavelength, as shown in FIG. 16. The new scanning of the substrate is performed for region 39. Region 39 is one which is adjacent to and overlaps an end region of region 36 that has been recrystallized by the previous first pulse laser light.

With this fabrication method of thin-film semiconductor, region 36 as well as region 39 (refer to FIG. 16) of amorphous silicon film 203 (refer to FIG. 1) on the surface of object 9 could be made into polycrystalline silicon.

Further, when the boundary portion between regions 36 and 39 was observed, no line-like defects were identified which have been conventionally produced in the boundary portion and caused problems, and a uniform polycrystalline silicon film was formed throughout regions 36 and 39.

In the present embodiment, since the second pulse laser light is applied as the edge processing step, the boundary portion with a next line is once made into amorphous. When scanning the next line by the first pulse laser light, the boundary portion has been made into amorphous and can sufficiently absorb energy so that crystals grow in a right direction in accordance with the scanning by the first laser light.

With this fabrication method, even when scanning the substrate multiple times to make a large region into polycrystalline silicon that cannot be covered by one scan, the seams can be prevented from becoming line-like defects and a uniform polycrystalline silicon film can be formed throughout the surface.

Indeed, like the present embodiment, if the second pulse laser light is focused and applied to an elongate shape which can totally cover the edge of region 36 parallel to the width direction of a thin line shaped irradiated region 33 (refer to FIG. 7(a)), irradiation of the second pulse laser light can be performed at a time so that it can be done in a short period of time and the scanning of the next line by the first pulse laser light can start swiftly.

(Second Embodiment)

Figure 17:
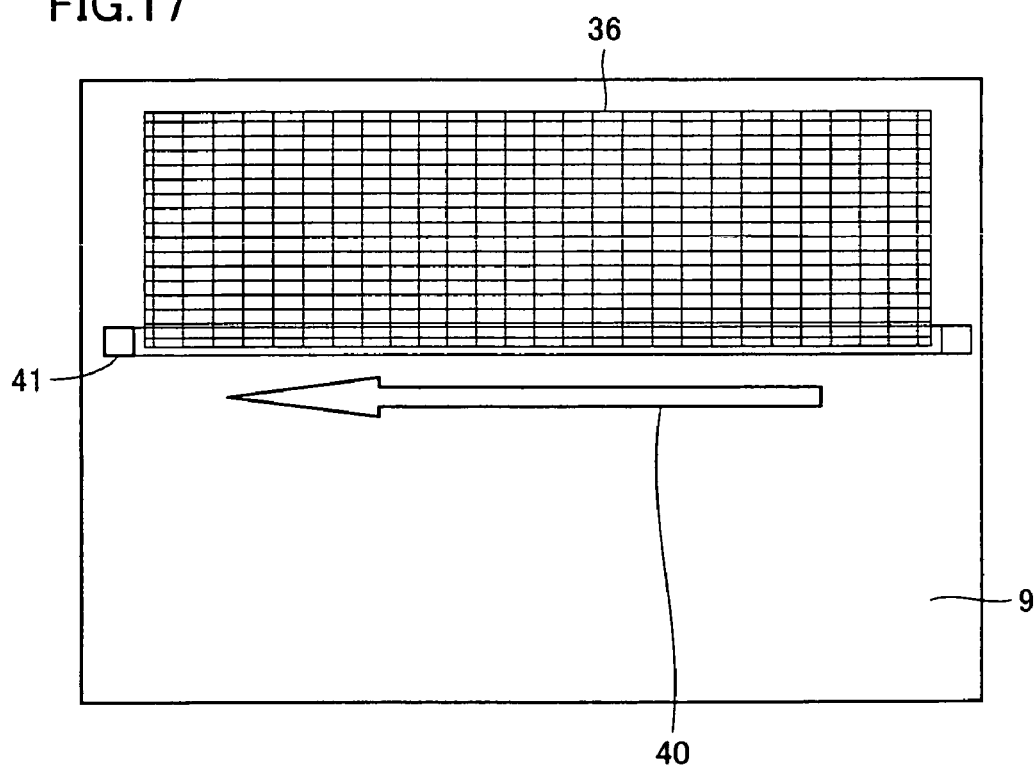
FIG. 17 shows an edge processing step included in a fabrication method of thin-film semiconductor in a second embodiment according to the present invention.

Referring to FIG. 17, a fabrication method of thin-film semiconductor in a second embodiment according to the present invention will be described. This fabrication method is basically similar to one described in the first embodiment except that the second pulse laser light is applied in a different manner in the edge processing step. In the first embodiment, the second pulse laser light is focused into an elongate shape which can totally cover the edge of region 36 parallel to the width direction of irradiated region 33, while, in the second embodiment, the second pulse laser light is formed into a beam pattern of a rectangle shape having a top flat profile both widthwise and lengthwise and scanning is performed by this rectangle shaped irradiated region 41. Scanning by region 41 of the second pulse laser light is performed along the entire length of the edge of region 36 parallel to the width direction of irradiated region 33, as shown by an arrow 40.

Other steps are the same as in the first embodiment.

In this case, since the second pulse laser light is formed into a beam pattern of a rectangle shape to scan the substrate, the beam's cross sectional area of the second pulse laser light can be smaller. With this method also, all boundary portions can be made into amorphous so that line-like defects can be prevented from occurring in the boundary portions when scanning the next line. In the present embodiment, a lower power laser of an ultraviolet wavelength can be used for the edge processing step, and a uniform polycrystalline silicon film can be stably formed throughout a desired region of the substrate at lower cost.

It should be understood that the embodiments and examples disclosed herein are illustrative and non-restrictive in every sense. The scope of the present invention is defined by the terms of the claims, rather than the description above, and is intended to include any modifications within the scope and meaning equivalent to the terms of the claims.

INDUSTRIAL APPLICABILITY

The present invention is applicable to fabrication of thin-film semiconductor.

The invention claimed is:

1. A method of fabricating thin-film semiconductor, comprising:
    a scanning irradiation step of, in order to form a polycrystalline silicon film on a surface of a substrate, focusing first pulse laser light having a visible wavelength into a line shape having an intensity distribution of an approximately Gaussian shape in a width direction on the surface of said substrate and applying said light such that said line shape is shifted in said width direction;
    an edge processing step of, after performing said scanning irradiation step in one position in one direction, applying second pulse laser light having an ultraviolet wavelength to an end region of an edge parallel to said width direction of a region having undergone the scanning irradiation; and
    a step of applying said scanning irradiation step again to cover a region that is adjacent to the region covered by said scanning irradiation step as well as overlaps said end region having undergone said edge processing step.

2. The method of fabricating thin-film semiconductor of claim 1, wherein said edge processing step is performed by focusing said second pulse laser light into an elongate shape which can totally cover said edge for irradiation.

3. The method of fabricating thin-film semiconductor of claim 1, wherein said edge processing step is performed by focusing said second pulse laser light into a rectangle shape to scan along said edge.

4. A method of fabricating a polycrystalline silicon film on a substrate by crystallizing an amorphous silicon film on the substrate, the method comprising, sequentially:
    focusing a laser beam of visible light into a linear shape having a length and a width, with a Gaussian intensity distribution along the width, on an amorphous silicon film;
    scanning the laser beam of visible light across the amorphous silicon film in a direction perpendicular to the length of the line shape, so the laser beam of visible light scans a first area including first and second end regions, lying along sides of the first area that are perpendicular to the length of the linear shape, and converts amorphous silicon in the first area into polycrystalline silicon;
    focusing a laser beam of ultraviolet light on the first end region;
    scanning the laser beam of ultraviolet light across the first end region in the direction perpendicular to the length of the linear shape to convert the first end region into amorphous silicon;
    focusing the laser beam of visible light on a line adjacent to the first area and overlapping the first end region; and
    scanning the laser beam of visible light in the direction perpendicular to the length of the linear shape to convert amorphous silicon into polycrystalline silicon in a second area adjacent to the first area.

5. The method of claim 4 including focusing the laser beam of ultraviolet light into an elongate shape before scanning the first end region.

6. The method of claim 4 including focusing the laser beam of ultraviolet light into a rectangular shape before scanning the first end region.

7. A method of fabricating a polycrystalline silicon film on a substrate by crystallizing an amorphous silicon film on the substrate, the method comprising, sequentially:

focusing a laser beam of visible light into a linear shape having a length and a width, with a Gaussian intensity distribution along the width, on an amorphous silicon film;

scanning the laser beam of visible light across the amorphous silicon film in a direction perpendicular to the length of the linear shape, so the laser beam of visible light scans a first area including first and second end regions, lying along sides of the first area that are perpendicular to the length of the linear shape, and converts amorphous silicon in the first area into polycrystalline silicon;

focusing a laser beam of ultraviolet light to cover the first end region and convert the first end region into amorphous silicon;

focusing the laser beam of visible light on a linear adjacent to the first area and overlapping the first end region; and scanning the laser beam of visible light in the direction perpendicular to the length of the linear shape to convert amorphous silicon into polycrystalline silicon in a second area adjacent to the first area.

8. The method of claim 7 including focusing the laser beam of ultraviolet light into an elongate shape covering the first end region.

9. The method of claim 7 including focusing the laser beam of ultraviolet light into a rectangular shape covering the first end region.

* * * * *